United States Patent
Rettig

(10) Patent No.: US 10,012,686 B2
(45) Date of Patent: Jul. 3, 2018

(54) HIGH FREQUENCY TIME DOMAIN REFLECTOMETRY PROBING SYSTEM

(71) Applicant: Tektronix, Inc., Beaverton, OR (US)

(72) Inventor: John B. Rettig, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/236,783

(22) Filed: Aug. 15, 2016

(65) Prior Publication Data

US 2018/0045769 A1 Feb. 15, 2018

(51) Int. Cl.
*G01R 27/04* (2006.01)
*G01R 27/32* (2006.01)
*G01R 31/11* (2006.01)
*G01R 1/067* (2006.01)

(52) U.S. Cl.
CPC .......... *G01R 31/11* (2013.01); *G01R 1/06772* (2013.01)

(58) Field of Classification Search
CPC ........ G01R 21/133; G01R 27/14; G06F 13/20
USPC ............. 324/76.11, 76.61, 76.69, 76.74, 103
See application file for complete search history.

(56) References Cited

U.S. PATENT DOCUMENTS

| | | | |
|---|---|---|---|
| 4,740,746 A | 4/1988 | Pollock et al. | |
| 5,835,327 A | 11/1998 | Siew et al. | |
| 6,617,972 B2* | 9/2003 | Takarada | G08B 21/0484 324/538 |
| 7,332,923 B2 | 2/2008 | Schott et al. | |
| 8,779,729 B2* | 7/2014 | Shiraishi | G01R 31/3606 320/134 |
| 9,335,343 B1 | 5/2016 | Cortez | |

(Continued)

FOREIGN PATENT DOCUMENTS

| | | |
|---|---|---|
| DE | 202010007229 | 10/2010 |
| EP | 1726965 | 11/2006 |
| WO | 2013/023360 | 2/2013 |

OTHER PUBLICATIONS

Unknown "Delivering high density and excellent frequency performance, SMPM RF Blind-Mate Connectors reduce system weight in comparison to larger connectors and increase manufacturability with the use of multiport connectors" Nov. 1, 2014, XP055430229, USA. Retrieved from the Internet: http://www.heilind.com/marketing/documents/molex/Molex_SMPM_RF_Blind_Mate_Connectors.PDF.

(Continued)

*Primary Examiner* — Giovanni Astacio-Oquendo
(74) *Attorney, Agent, or Firm* — Andrew J. Harrington

(57) ABSTRACT

A probe includes a self-aligning connector set, a moveable probe tip, a cable, a housing, and a spring. When the probe tip is pressed to a test point on a device-under-test, the probe tip moves within the housing to cause a first connector and a second connector of the self-aligning connector set to be connected through an adapter of the self-aligning connector set, thereby establishing a signal path through the probe. The first connector, second connector, and adapter are structured so that their respective ground conductors become connected prior to their respective signal conductors becoming connected. Electro-static charge present at the test point is safely discharged through a resistor to ground before the signal path through the probe is established, thereby preventing damage to the probe and connected host instrument. When the probe tip is removed from the device-under-test, the spring forces a disconnection of the first and second connectors.

20 Claims, 5 Drawing Sheets

(56) References Cited

U.S. PATENT DOCUMENTS

| | | | | |
|---|---|---|---|---|
| 2004/0164758 A1* | 8/2004 | Nagar | ............... | G01R 1/07314 |
| | | | | 324/755.07 |
| 2008/0290885 A1* | 11/2008 | Matsunami | ........ | G01R 31/2889 |
| | | | | 324/762.01 |
| 2012/0098518 A1* | 4/2012 | Unagami | ............ | G01R 22/066 |
| | | | | 324/74 |
| 2017/0160341 A1* | 6/2017 | Hong | .................. | G01R 1/0416 |

OTHER PUBLICATIONS

European Patent Office, Extended European Search Report and Opinion for European Patent Application 17186251.9, dated Jan. 22, 2018, 11 pages, European Patent Office, Munich, Germany.

* cited by examiner

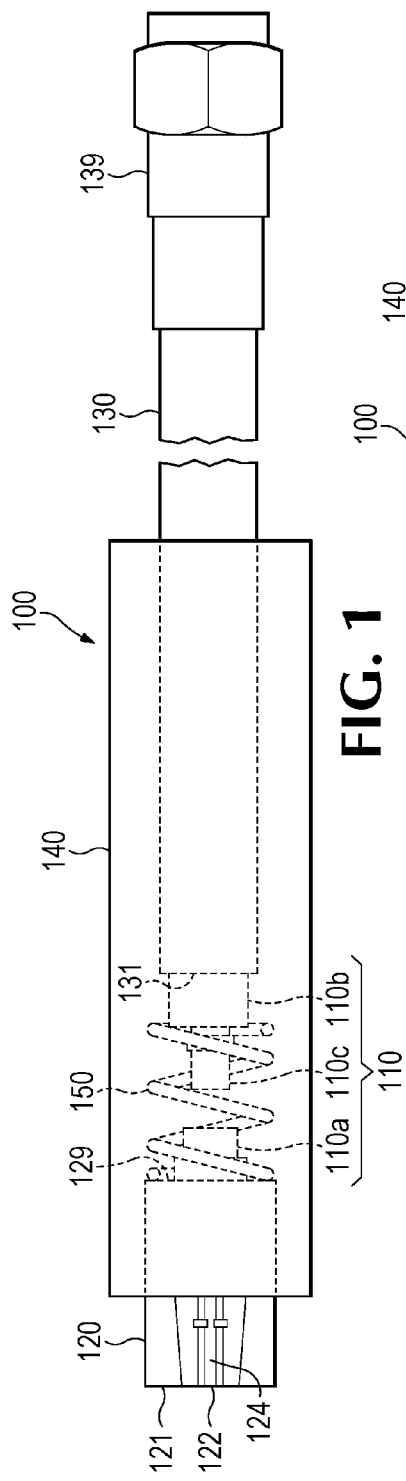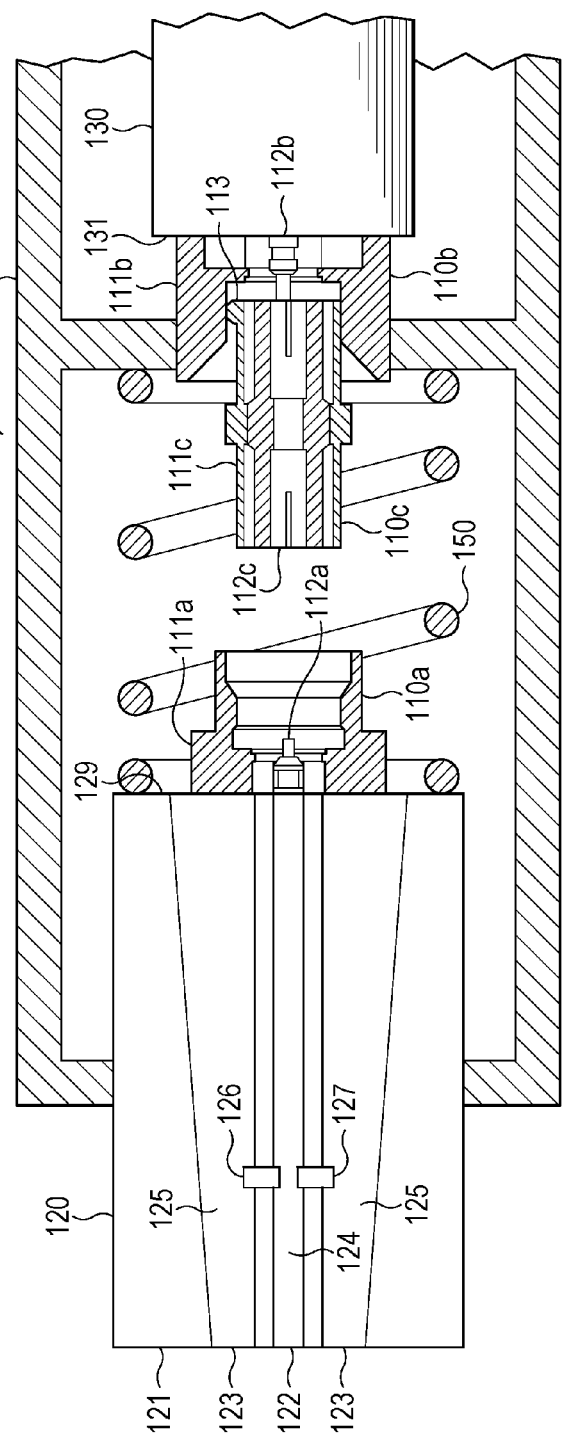

HIGH FREQUENCY TIME DOMAIN REFLECTOMETRY PROBING SYSTEM

TECHNICAL FIELD

This disclosure relates to test and measurement instruments, and more particularly to probing systems for time domain reflectometry applications.

BACKGROUND

Time domain reflectometry (TDR) is a widely-used measurement technique for determining the characteristics of an electrical line, such as a broadband internet cable. In general, a TDR analysis involves propagating a stimulus signal, typically a step or an impulse signal, into the line being measured, then measuring the signal that is reflected back from any electrical discontinuities in the line. The amplitude of the reflected signal may be used to determine the impedance of the discontinuity and the time it takes for the reflected signal to return may be used to determine the physical location of the discontinuity in the line.

A TDR measurement may be performed using a general-purpose test and measurement instrument, such as a DSA8300 series sampling oscilloscope manufactured by Tektronix, Inc. Such an instrument may be configured with a specialized TDR hardware module, and may run specialized TDR software to guide the user in properly connecting the instrument to the device-under-test (DUT) and to calculate the measurement results. A user of such an instrument typically connects the instrument to the DUT using a probing system designed to perform TDR measurements.

One challenge in designing a TDR probing system is that the inputs of instruments used to perform TDR measurements are generally necessarily highly sensitive in order to accurately measure the typically low amplitude reflected signals. For example, the inputs of a TDR module in a DSA8300 oscilloscope have an input DC voltage limit of about 2-3 Volts. The module can suffer permanent damage if subjected to higher voltages. Due to this high sensitivity, TDR modules are also especially prone to damage from electro-static discharge (ESD). In fact, a common field failure for TDR modules is ESD damage caused when a user connects a TDR probe to a DUT. Any electrical charge that may have built up on the DUT is immediately conducted by the probe to the inputs of the TDR module. Therefore, what is needed is a TDR probe designed to protect the instrument from ESD damage.

SUMMARY OF THE DISCLOSURE

A probe, according to embodiments of the invention, includes a self-aligning connector set, a moveable probe tip, a cable, a housing, and a spring. When a user presses the probe tip to a test point on a DUT, the probe tip moves within the housing against the force of the spring to cause a first connector and a second connector of the self-aligning connector set to be connected through an adapter of the self-aligning connector set, thereby establishing a signal path through the probe. The first connector, second connector, and adapter are structured so that their respective ground conductors become connected prior to their respective signal conductors becoming connected. Any potentially damaging electro-static charge that may be present at the DUT test point is safely discharged through an electro-static discharge resistor to ground before the signal path through the probe is established, thereby preventing damage to the probe and connected host instrument. When the user removes the probe tip from the DUT, the spring forces a break in the signal path by disconnecting the first and second connectors. In other embodiments, the probe includes two self-aligning connector sets and two cables in order to be suitable for probing differential signals.

A method for protecting a probe and a connected host instrument from electro-static discharge damage, according to embodiments of the invention, includes, when a user is not probing a device-under-test, applying a spring force to a moveable probe tip to keep a connector on the probe tip disconnected from a probe cable that is connected to the host instrument. The method also includes, in response to the user probing the device-under-test, causing a ground conductor of the probe cable to connect to a ground conductor of the probe cable before a signal conductor of the connector connects to a signal conductor of the probe cable and the connected host instrument, such that a charge present on the device-under-test discharges through a high resistance electro-static discharge resistor coupled between the signal conductor and the ground conductor.

BRIEF DESCRIPTION OF THE DRAWINGS

FIG. 1 is a plan view of a probe according to embodiments of the invention.

FIGS. 2A and 2B are cross-sectional views showing internal details of a probe according to embodiments of the invention.

DETAILED DESCRIPTION

Figure 2B:
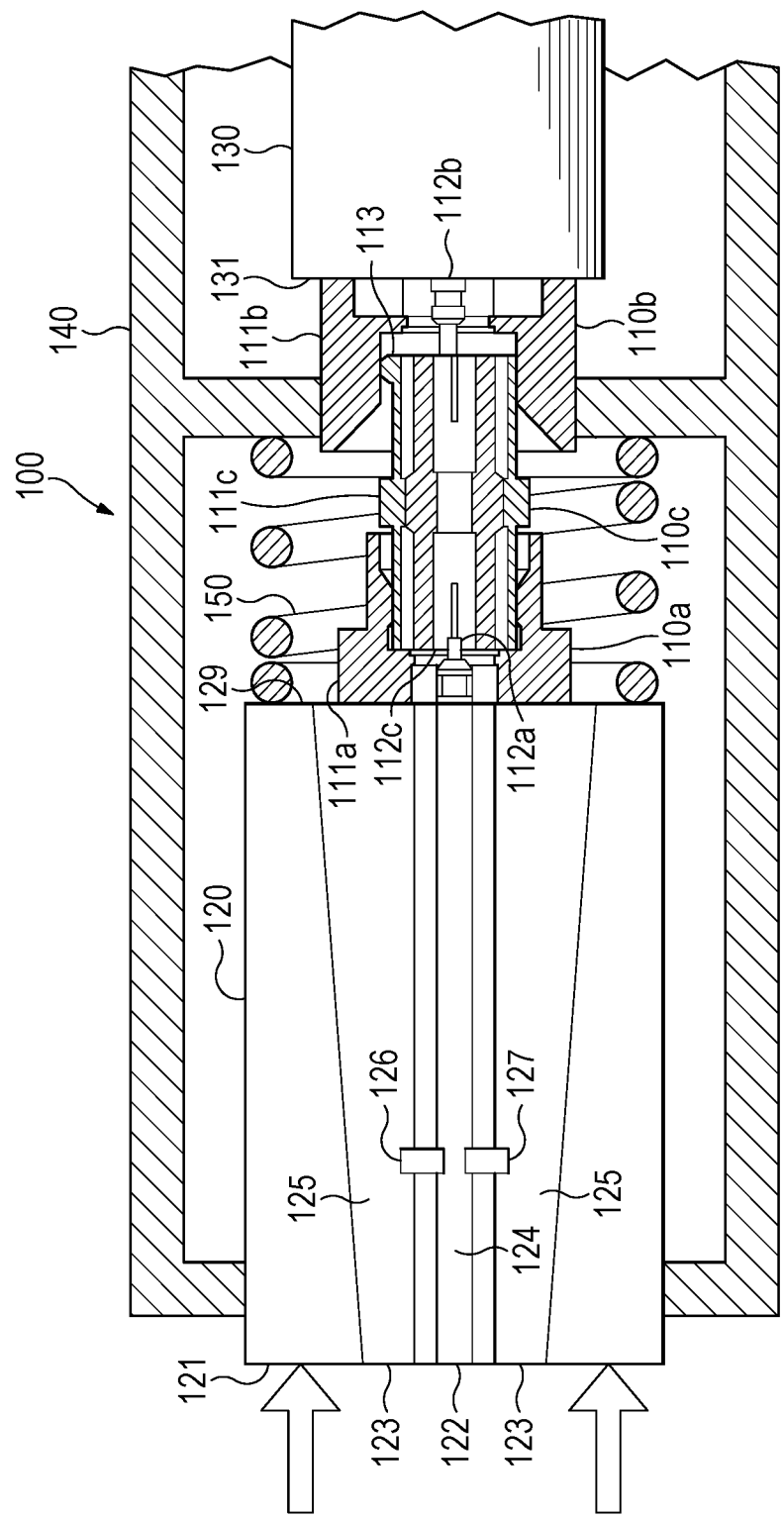

In general, to protect the inputs of a TDR measurement instrument from being damaged by ESD, one known technique is to employ a switch capable of directing the signal path of the probe to one of two electrical paths: one path to ground, and one path to an input of the TDR instrument. Such switch-based probing systems are designed so that they direct the signal path of the probe to ground at the time that a user contacts a DUT with the probe. In this way, when the probe makes contact with the DUT, any electro-static charge that may be built up on the DUT will be safely discharged to ground rather than being discharged through the highly sensitive input of the TDR instrument. After any such charge has been safely discharged, the switch then re-directs the probe signal path to the input of the TDR instrument in order to perform a TDR measurement. Conventional TDR probes use various active switching circuits to direct the signal path of the probe.

Some conventional TDR accessory modules, such as the model 80A02 ESD protection module manufactured by Tektronix, Inc., introduce a relay into the TDR signal path. The relay may be actuated manually, for instance, by an external foot switch. The foot switch is intended to be actuated by a user prior to the user connecting the probe to a DUT. The switch causes the relay to direct the signal path of the probe to ground so that when the probe contacts the DUT, any electrical charge built up on the DUT discharges safely to ground. The user then de-actuates the foot switch, causing the relay to direct the signal path of the probe back to the input of the TDR instrument in order to perform a TDR measurement. This type of probing system is prone to failure since it relies on the user remembering to actuate the foot switch every time she connects the probe to a DUT; if the user forgets, the TDR instrument may suffer ESD damage.

Other conventional TDR probes, such as the P8018 probe manufactured by Tektronix, Inc., use a more automated switching technique. In these probing systems, the tip of the probe compresses slightly when the probe is pressed by a user against the DUT. The tip of the probe is connected to a switch so that compression of the tip actuates the switch. Like the foot-switch-based probing system described above, this switch is then connected to a relay in the signal path. When the tip is uncompressed, the relay directs the signal path of the probe to ground. Therefore, when the tip first makes contact with the DUT, any built-up charge is safely discharged to ground. When the user presses the tip against the DUT into its compressed state, the switch is actuated, causing the relay to direct the signal path to the input of the TDR instrument in order to perform a TDR measurement. This more automatic type of switching system eliminates the potential of user error, that is, the user forgetting to actuate the relay by foot switch. However, this type of system is still prone if fail because both the switch and the relay are guaranteed for only a certain finite number of cycles and will both eventually fail.

Embodiments of the invention eliminate both the issue of user error, as well as the issue of long term switch or relay failure, by using a passive, in-line physical disconnect of the probe's signal path, rather than an active switch-based system.

Passive In-Line Physical Signal Path Disconnect

FIGS. 1, 2A, and 2B illustrate a probe 100 according to embodiments of the invention. The probe 100 is suitable for performing TDR analysis, as well as other types of measurements. FIG. 1 illustrates the overall form of the probe 100, showing some internal components in dashed lines. FIGS. 2A and 2B are cross-sectional views of a portion of the probe 100, showing the internal components in greater detail.

The probe 100 includes a self-aligning connector set 110. The self-aligning connector set 110 includes a first connector 110a, a second connector 110b, and an adapter 110c. The adapter 110c is structured to be capable of connecting the first connector 110a and the second connector 110b. The term "self-aligning" means that the connector set 110 may be blind-mated and that, due to the structure of the connector set 110, the action of mating the connector set 110 together self-corrects a tolerable degree of misalignment between the components 110a, 110b, 110c in order to provide a quality electrical connection. "Blind-mating" means that the components 110a, 110b, 110c may be connected together without having to use any threads, wrenches, or other tools. The self-aligning feature of the connector set 110 is generally achieved by having the adapter 110c structured to accommodate both axial and radial misalignment between the first connector 110a and the second connector 110b.

Each of the components 110a, 110b, 110c of the connector set 110 has a ground conductor 111a, 111b, 111c and a signal conductor 112a, 112b, 112c. In some embodiments, the components 110a, 110b, 110c are coaxial and therefore have a cross-section of a center signal conductor and a surrounding coaxial ground conductor. The components 110a, 110b, 110c are structured so that when the adapter 110c connects the first connector 110a with the second connector 110b, the respective ground conductors 111a, 111b, 111c make electrical contact prior to the respective signal conductors 112a, 112b, 112c making electrical contact.

In some embodiments, the connector set 110 may be a commercially-available off-the-shelf interconnect system. Commercially-available interconnect systems are available in a variety of physical sizes and electrical specifications. In preferred embodiments, to minimize the physical size of the probe 100 while maximizing its electrical performance, the self-aligning connector set 110 comprises a Sub-Miniature Push-on Micro (SMPM) Radio Frequency (RF) blind-mate connector system, such as, for example, the 73300 Series of SMPM RF Blind-Mate Connectors manufactured by Molex Corporation (see http://www.literature.molex.com/SQLImages/kelmscott/Molex/PDF_Images/987651-1642.PDF). In commercially-available SMPM blind-mate connector systems, the first and second connectors 110a, 110b are also commonly called "plugs," and the adapter 110c is also commonly called a "bullet." Commercially-available bullets are generally made with ends that are either smooth-bore, allowing an end to freely slide in and out of a mating plug, or with ends that having retention features so that an end is captured and retained by its mating plug. In preferred embodiments, the adapter 110c includes a retention feature 113 on the end that mates with the second connector 110b so that the adapter 110c is captured and retained by the second connector 110b, while the end that mates with the first connector 110a is smooth bore so that the adapter 110c freely mates and de-mates the first connector 110a.

The probe 100 also includes a probe tip 120. The probe tip 120 is partially enclosed in, but movable with respect to, a housing 140. The probe tip 120 has a first end 121 that protrudes out of the housing 130, and a second end 129 that is within the housing 140. As shown by FIGS. 2A and 2B, the probe tip 120 is able to slide partially into and out of the housing 140. The probe tip has a device-under-test contact 122 disposed at the first end 121, and has the first connector 110a of the self-aligning connector set 110 disposed at a second end 129. The probe tip 120 is structured to provide an electrical path 124 between the device-under-test contact 122 and the first connector 110a. As shown in FIG. 2B, when a user presses the first end 121 of the probe tip to a device under test in order to probe the DUT, the probe tip 120 slides partially into the housing 140, thereby causing the first and second connectors 110a, 110b to be connected through the adapter 110c.

Further, the probe 100 includes a cable 130 having a first end 131 and a second end 139. The first end 131 of the cable 130 is coupled to the second connector 110b of the self-aligning connector set 110. The second end 139 of the cable 130 is adapted for connecting to a host instrument (not shown). The second end 139 of the cable 130 may be adapted for connecting to a host instrument using the appropriate type of connector for mating to an input connector on the host instrument. TDR modules in a host instrument often use female SMA input connectors. Therefore, in some embodiments, such as the embodiment illustrated in FIG. 1, the second end 139 of the cable 130 may be terminated with a mating male SMA connector.

Finally, the probe 100 includes a spring 150. The spring 150 is structured to cause the first and second connectors 110a, 110b, to be disconnected when the probe 100 is not probing a device under test. That is, when a user presses the probe tip 120 onto a device under test, the spring 150 compresses to allow the first and second connectors 110a, 110b to be connected through the adapter 110c. Conversely, when a user removes the probe tip 120 from a device under test, the spring 150 expands and forces a break in the connection between the components 110a, 110b, 110c of the self-aligning connector set 110. In preferred embodiments, such as those illustrated in FIGS. 1, 2A, and 2B, the spring 150 is disposed between the probe tip 120 and an interior wall of the housing 140 so as to force the first connector 110a to disconnect from the adapter 110c when pressure is removed from the first end 121 of the probe tip 120.

Exchangeable Probe Tip

The probe tip 120 of the probe 100 is designed to be exchangeable. That is, a user may remove a particular probe tip 120 from the probe 100, and install a different probe tip 120. Exchanging the probe tip 120 may be necessary if the probe tip 120 becomes defective, for example, through wear-out, or when the user needs to probe test points with a different geometry on a device under test. A particular probe tip 120 may have its device-under-test contact 122 disposed on the first end 121 of the probe tip 120 so that the device-under-test contact 122 is aligned with a particular test point on the device under test. In many embodiments, the probe tip 120 will have at least a pair of device-under-test contacts 122 disposed on the first end 121 with inter-contact spacing that matches the spacing of a pair of test points on the device under test, for example, the spacing between a signal pad and a ground pad when probing a single-ended signal. In general, the probe tip 120 provides an electrical path from the device-under-test contact 122 to the first connector 110a of the self-aligning connector set 110.

In preferred embodiments, the probe tip 120 comprises a rigid printed circuit board (PCB). Using a PCB for the probe tip 120 offers the advantage of being low cost, yet having a desirable rigidity necessary to actuate the spring 150 when the user presses the first end 121 of the probe tip 120 to a device under test. Furthermore, using a PCB for the probe tip 120 enables preferred embodiments to have a device-under-test contact 122 that comprises edge plating on the first end 121 of the probe tip 120. Edge plating is a well known, widely used, and therefore generally relatively inexpensive process for creating a physically and electrically robust device-under-test contact 122.

In some applications, the signal to be probed in the DUT is a single-ended signal. Thus, according to embodiments designed for these applications, the probe tip 120 PCB includes a pair of device-under-test contacts 122: a device-under-test signal contact, and a corresponding device-under-test ground contact. In these embodiments, the probe tip 120 PCB also includes an electrical signal path between the device-under-test signal contact and a signal conductor of the first connector 110a of the self-aligning connector set 110, and an electrical ground path between the device-under-test ground contact and a ground conductor of the first connector 110a. Lastly in these embodiments, the probe tip 120 also includes a high resistance electro-static discharge (ESD) resistor coupled between the signal path and the ground path. The value of the electro-static discharge resistor must be large enough, such as, for example, around 100 kΩ, to adequately discharge to ground any electro-static charge that may be present on the DUT test point when a user contacts the test point with the probe tip 120. In some embodiments, the device-under-test signal contact and the device-under-test ground contact are arranged on the first end 121 of the probe tip 120 to match the spacing of a pair of test points on a device under test, for example a signal test point and a ground test point.

In other applications, the signal to be probed in the DUT is a single-ended signal and the test points on the DUT comprise a ground-signal-ground (GSG) coplanar waveguide. Thus, according to embodiments designed for these applications, such as the embodiment illustrated in FIGS. 1, 2A, and 2B, the probe tip 120 PCB includes a device-under-test signal contact 122, an electrical signal path 124 from the device-under-test signal contact 122 to the signal conductor 112a of the first connector 110a, two device-under-test ground contacts 123, an electrical ground path 125 from each of the device-under-test ground contacts 123 to the ground conductor 111a of the first connector 110a, a first high resistance electro-static discharge resistor 126 coupled between the signal path 124 and the first ground path 125, and a second high resistance electro-static discharge resistor 127 coupled between the signal path 124 and the second ground path 125. In these embodiments, the signal contact 122 and the two ground contacts 123 are arranged on the first end 121 of the probe tip 120 PCB in order to match the pitch of the GSG coplanar waveguide on the DUT.

Overvoltage Sensing Circuit

Figure 3:
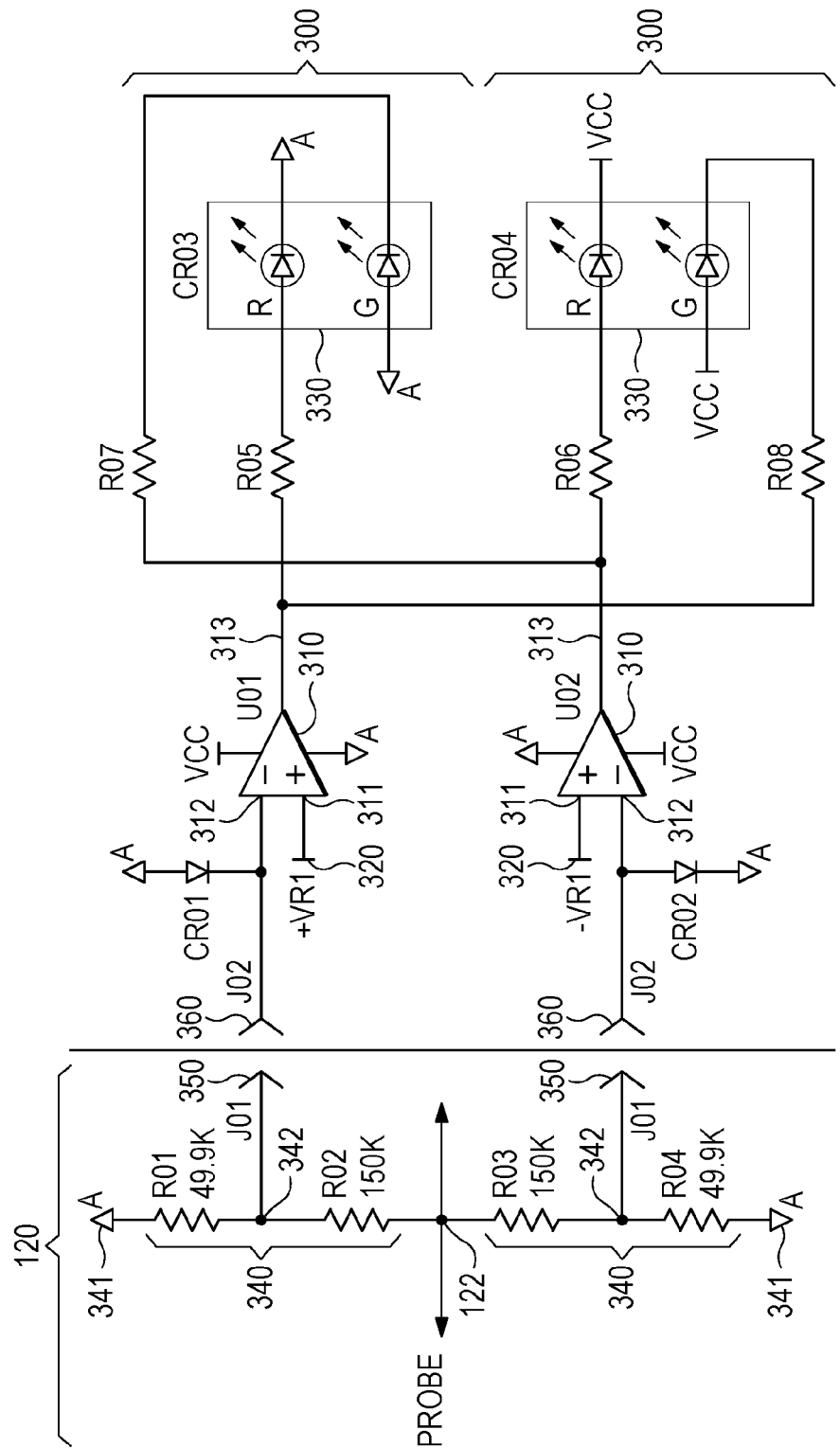
FIG. 3 is circuit diagram of a sensing circuit for a probe according to embodiments of the invention.

The probe 100, according to some embodiments, also includes a circuit configured to sense the voltage present at the DUT test point and indicate if the sensed voltage exceeds the maximum input voltage specification of the probe 100 or host instrument. FIG. 3 is a diagram of one embodiment of such a sensing circuit 300. The circuit 300 includes a comparator 310, a reference voltage 320, an indicator 330, a resistor divider network 340, a first pickoff connector 350, and a second pickoff connector 360. The comparator 310 has a reference input 311, a signal input 312, and an output 313. The reference voltage 320 is coupled to the reference input 311. The indicator 330 is coupled to the output 313.

In preferred embodiments, the reference voltage 320 is based on a specified input voltage limit for a host instrument and the indicator 330 is coupled to the output 313 so that the indicator 330 indicates when the sensed voltage exceeds the reference voltage 320. For example, a typical maximum specified input voltage for a TDR module is +/−3 V. In this case, the reference voltage 320 is set to +0.75 V; that is, one-fourth of +3 V in order to account for the voltage dividing of the resistor divider network 340. Thus, if the voltage at the input of the probe tip 120 exceeds +3 V, the voltage at the signal input 312 of the comparator 310 will exceed +0.75 V, the output 313 of the comparator 310 will go high, and the indicator 330 will indicate that the sensed voltage exceeds the reference voltage 320. As shown in FIG. 3, one instance of the circuit 300 is used to detect a positive overvoltage condition, and a second instance of the circuit 300 is used to detect a negative overvoltage condition.

In preferred embodiments, the indicator 330 is a light-emitting diode (LED). For example, as shown in FIG. 3, the indicator 330 CR03 includes a red LED that, when lit, indicates that it is not safe to connect the probe 100 to the DUT because of a positive overvoltage condition. Likewise, the indicator 330 CR04 includes a red LED that, when lit, indicates that it is not safe to connect the probe 100 to the DUT because of a negative overvoltage condition. Each of the indicators 330, CR03 and CR04, also include green LEDs that are driven complementary to the red LEDs and indicate that it is safe to connect the probe 100 to the DUT. In other embodiments, the number of LEDs is reduced by logically combining the outputs 313 of the two instances of the circuit 300 to drive a single LED that indicates either a positive or negative overvoltage condition.

The resistor divider network 340 is disposed on the probe tip 120. The resistor divider network 340 is coupled between the device-under-test contact 122 and a ground node 341 disposed on the probe tip 120. For example, in the embodiment of the circuit 300 shown in FIG. 3, the two resistors R01 and R02 form the resistor divider network 340, and are coupled between the input at the device-under-test contact 122 and the ground node 341. In preferred embodiments, the resistor divider network 340 provides a high resistance electro-static discharge path to the ground node 341. For example, as shown in FIG. 3, the resistor divider network 340, in parallel with a second identical resistor divider network 340, provides a 100 kΩ path to ground. Therefore, when a user contacts the probe tip 120 to a test point on the DUT, the resistor divider network will safely discharge any charge present at the DUT test point safely to ground rather than through the probe 100 and into a connected host instrument.

The first pickoff connector 350 is also disposed on the probe tip 120. The first pickoff connector 350 has a signal conductor coupled to an intermediate node 342, that is, the pickoff node, of the resistor divider network 340. The second pickoff connector 360 is disposed within the housing 140. The second pickoff connector 360 has a signal conductor coupled to the signal input 312 of the comparator 310. The first and second pickoff connectors 350, 360 are connected to each other so that the circuit 300 can sense the voltage present at the DUT test point, and alert a user to an overvoltage condition, prior to that voltage being applied to a connected host instrument through connection of the first and second connectors 110a, 110b of the self-aligning connector set 110. The first and second pickoff connectors 350, 360 may be disconnected to remove and exchange the probe tip 120.

In preferred embodiments, the first and second pickoff connectors 350, 360 self-align to each other. This may be achieved by selecting an appropriate blind-mate connector system for the first and second pickoff connectors 350, 360. However, since the first and second pickoff connectors 350, 360 are only conveying essentially DC voltages, they need not be high performance connectors like those of the self-aligning connector set 110. The first pickoff connector 350 is preferably coupled to the intermediate node 342 of the resistor divider network 340 with a flexible connection, such as a cable or flex circuit, in order to accommodate the lateral movement of the probe tip 120.

Differential Signal Probing

Figure 4:
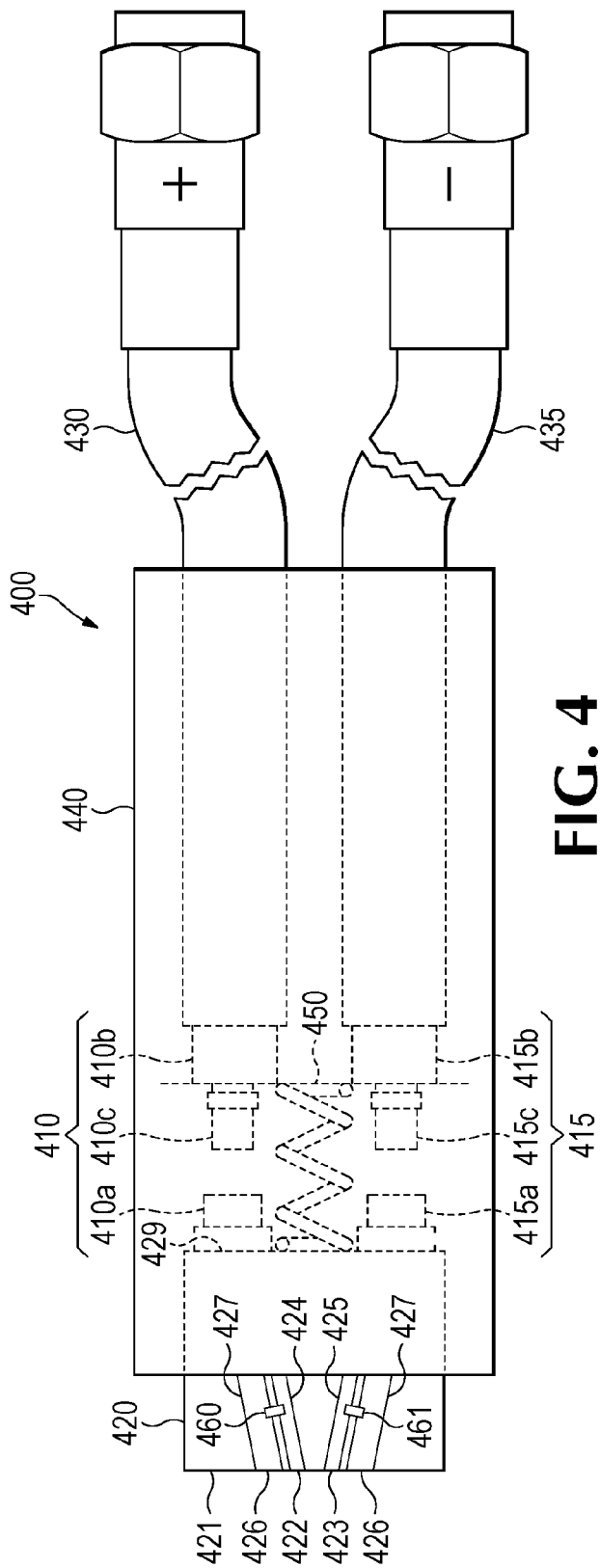
FIG. 4 is a plan view of a probe according to embodiments of the invention.

In some applications, the signal to be probed in the DUT is a differential signal. FIG. 4 illustrates an embodiment of a probe 400 suitable for probing such a differential signal. The probe 400 includes a first self-aligning connector set 410 and a second self-aligning connector set 415. The first self-aligning connector set 410 includes a first connector 410a, a second connector 410b, and a first adapter 410c, each having a respective signal conductor and ground conductor. Likewise, the second self-aligning connector set 415 includes a third connector 415a, a fourth connector 415b, and a second adapter 415c, each having a respective signal conductor and ground conductor. In preferred embodiments, the first self-aligning connector set 410 and the second self-aligning connector set 415 are each structured so that when the first adapter 410c connects the first and second connectors 410a, 410b, and the second adapter 415c connects the third and fourth connectors 415a, 415b, the respective ground conductors make electrical contact prior to the respective signal conductors making electrical contact.

The probe 400 also includes a moveable probe tip 420 for physically contacting the DUT. The probe tip 420 has an exposed first end 421 for making contact with the DUT, and a second end 429 enclosed within a housing 440 of the probe 400. First and second device-under-test signal contacts 422, 423 are disposed at the first end 421. The probe tip 420 provides first and second electrical signal paths 424, 425 between the first and second device-under-test signal contacts 422, 423, and the signal conductors of the first and third connectors 410a, 415a, respectively. The probe tip 420 also provides a ground path 427 between at least one device-under-test ground contact 426 disposed at the first end 421 and at least one of the ground conductors of the first and third connectors 410a, 415a.

The probe 400 also includes a first cable 430 and a second cable 435, each having a first end and a second end. The first end of the first cable 430 is coupled to the second connector 410b. The first end of the second cable 435 is coupled to the fourth connector 415b. The second ends of both cables 430, 435 are each adapted for connecting to a host instrument. For example, as illustrated in FIG. 4, in some embodiments, the second ends of each cable 430, 435 include threaded male SMA connectors for attaching to respective female SMA connectors on the front panel of the host instrument.

When a user probes a DUT by pressing the first end 421 of the probe tip 420 to the DUT with sufficient force, the probe tip 420 slides laterally within the housing 440 to simultaneously cause the first and second connectors 410a, 410b to be connected through the first adapter 410c, and the third and fourth connectors 415a, 415b to be connected through the second adapter 415c. In this way, electrical signal paths are created between the first device-under-test signal contact 422 and the first cable 430, and between the second device-under-test signal contact 423 and the second cable 435. Thus, a differential signal present at the DUT test points probed by contacts 422, 423 is conveyed to the host instrument.

Finally, the probe 400 includes a spring 450. When a user removes the probe tip 420 from the DUT, the spring 450 is structured to cause the first and second connectors 410a, 410b to disconnect, and the third and fourth connectors 415a, 415b to disconnect, thereby breaking the electrical signal paths through the probe 400.

In preferred embodiments, the probe tip 420 includes a first high resistance electro-static discharge resistor 460 and a second high resistance electro-static discharge resistor 461. The first high resistance electro-static discharge resistor 460 is coupled between the first electrical signal path 424 and the ground path 427. The second high resistance electro-static discharge resistor 461 is coupled between the second electrical signal path 425 and the ground path 427. The first and second device-under-test signal contacts 422, 423, and the device-under-test ground contact 426 are arranged to match the pitch of a differential ground-signal-signal-ground (GSSG) coplanar waveguide on the DUT. In this way, when a user probes the contacts 422, 423, 426 to the DUT, the first and second electro-static discharge resistors 460, 461 discharge any potentially harmful charge that may be present at the DUT test points prior to the connection of the first and second connectors 410a, 410b through the first adapter 410c, and prior to the connection of the third and fourth connectors 415a, 415b through the second adapter 415c.

Electro-Static Discharge Protection Method

Figure 5:
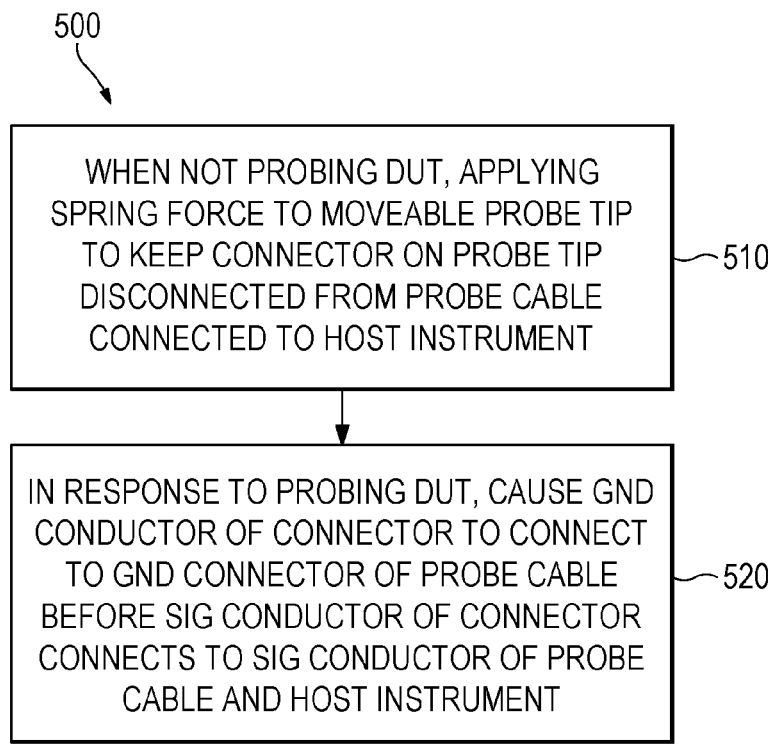
FIG. 5 is a flowchart of a method according to embodiments of the invention.

FIG. 5 illustrates a method 500 for protecting a probe, and a host instrument to which the probe is connected, from electro-static discharge damage. The method 500 includes a step 510 of, when the probe is not probing a DUT, applying a spring force to a moveable probe tip in the probe to keep a connector on the probe tip disconnected from a probe cable that is connected to the host instrument. The probe will remain in this state when not being used to probe a DUT. The method 500 also includes a step 520 of, in response to the user probing the DUT with sufficient force to overcome the spring force, causing a ground conductor of the connector to connect to a ground conductor of the probe cable before a signal conductor of the connector connects to a signal conductor of the probe cable and the connected host instrument, such that a charge present on the DUT discharges through a high resistance electro-static discharge resistor coupled between the signal conductor and the ground conductor. Thus, by keeping the electrical signal path in the probe physically broken when the probe is not probing a DUT, and by ensuring that the ground path is connected before the signal path when the probe does probe a DUT, the method 500 ensures that any potentially harmful electrostatic charge will be safely discharged to ground rather than through the signal conductor in the probe and into the connected host instrument.

Although specific embodiments of the invention have been illustrated and described for purposes of illustration, various modifications may be made without departing from the spirit and scope of the invention. Accordingly, the invention should not be limited except as by the appended claims.

What is claimed is:

1. A probe comprising:
    a self-aligning connector set comprising a first connector, a second connector, and an adapter structured to be capable of connecting the first and second connectors;
    a probe tip having a first end and a second end, the probe tip structured to provide an electrical path between a device-under-test contact disposed at the first end and the first connector disposed at the second end;
    a cable having a first end and a second end, the first end being coupled to the second connector, and the second end being adapted for connecting to a host instrument;
    a housing, in which the probe tip moves to cause the first and second connectors to be connected through the adapter when the probe is probing a device under test; and
    a spring structured to cause the first and second connectors to be disconnected when the probe is not probing a device under test.

2. The probe according to claim 1 in which the first connector, the second connector, and the adapter of the self-aligning connector set each have a ground conductor and a signal conductor, and are each structured so that when the adapter connects the first and second connectors the respective ground conductors make electrical contact prior to the respective signal conductors making electrical contact.

3. The probe according to claim 1 in which the self-aligning connector set comprises a Sub-Miniature Push-on Micro (SMPM) Radio Frequency (RF) blind-mate connector set.

4. The probe according to claim 1 in which the adapter is captured and retained by the second connector.

5. The probe according to claim 1 in which the probe tip is exchangeable.

6. The probe according to claim 1 in which the probe tip comprises a printed circuit board.

7. The probe according to claim 6 in which the device-under-test contact comprises edge plating on the first end of the probe tip printed circuit board.

8. The probe according to claim 6 in which the probe tip printed circuit board comprises:
    a device-under-test signal contact;
    a device-under-test ground contact;
    a signal path between the device-under-test signal contact and a signal conductor of the first connector;
    a ground path between the device-under-test ground contact and a ground conductor of the first connector; and
    a high resistance electro-static discharge resistor coupled between the signal path and the ground path.

9. The probe according to claim 8 in which the device-under-test signal contact and the device-under-test ground contact are arranged to match the spacing of a pair of test points on a device under test.

10. The probe according to claim 8 in which the probe tip printed circuit board further comprises:
    a second device-under-test ground contact;
    a second ground path between the second device-under-test ground contact and the ground conductor of the first connector; and
    a second high resistance electro-static discharge resistor coupled between the signal path and the second ground path;
    in which the device-under-test signal contact and the first and second device-under-test ground contacts are arranged to match the pitch of a single-ended ground-signal-ground coplanar waveguide on a device under test.

11. The probe according to claim 1 further comprising a sensing circuit configured to sense a voltage at the device-under-test contact on the probe tip.

12. The probe according to claim 11 in which the sensing circuit comprises:
    a comparator having a reference input, a signal input, and an output;
    a reference voltage coupled to the reference input of the comparator;
    an indicator coupled to the output of the comparator;
    a resistor divider network disposed on the probe tip and coupled between the device-under-test contact and a ground node disposed on the probe tip;
    a first pickoff connector disposed on the probe tip, the first pickoff connector having a signal conductor coupled to an intermediate node of the resistor divider network; and
    a second pickoff connector disposed within the housing, the second pickoff connector being connected to the first pickoff connector and having a signal conductor coupled to the signal input of the comparator.

13. The probe according to claim 12 in which the reference voltage is based on a specified input voltage limit for a host instrument and the indicator is coupled to the output of the comparator so that the indicator indicates when the sensed voltage exceeds the reference voltage.

14. The probe according to claim 12 in which the indicator comprises a light emitting diode.

15. The probe according to claim 12 in which the resistor divider network provides a high resistance electro-static discharge path to the ground node.

16. The probe according to claim 12 in which the first and second pickoff connectors self-align to each other.

17. A probe comprising:
    a first self-aligning connector set comprising a first connector, a second connector, and a first adapter structured to be capable of connecting the first and second connectors, each of the first connector, second connector, and first adapter having a respective signal conductor and a ground conductor;
    a second self-aligning connector set comprising a third connector, a fourth connector, and a second adapter structured to be capable of connecting the third and fourth connectors, each of the third connector, fourth connector, and second adapter having a respective signal conductor and ground conductor;

a probe tip having a first end and a second end, the probe tip structured to provide a first electrical signal path between a first device-under-test signal contact disposed at the first end and the signal conductor of the first connector disposed at the second end, a second electrical signal path between a second device-under-test signal contact disposed at the first end and the signal conductor of the third connector disposed at the second end, and a ground path between at least one device-under-test ground contact disposed at the first end and at least one of the ground conductors of the first and third connectors;

a first cable having a first end and a second end, the first end being coupled to the second connector, and the second end being adapted for connecting to a host instrument;

a second cable having a first end and a second end, the first end being coupled to the fourth connector, and the second end being adapted for connecting to the host instrument;

a housing, in which the probe tip moves to cause the first and second connectors to be connected through the first adapter, and the third and fourth connectors to be connected through the second adapter, when the probe is probing a device under test; and a spring structured to cause the first and second connectors to be disconnected, and the third and fourth connectors to be disconnected, when the probe is not probing a device under test.

18. The probe according to claim 17 in which the first connector set and the second connector set are each structured so that when the first adapter connects the first and second connectors, and second adapter connects the third and fourth connectors, the respective ground conductors make electrical contact prior to the respective signal conductors making electrical contact.

19. The probe according to claim 17, further comprising:
a first high resistance electro-static discharge resistor coupled between the first electrical signal path and the ground path on the probe tip; and
a second high resistance electro-static discharge resistor coupled between the second electrical signal path and the ground path on the probe tip;
in which the first and second device-under-test signal contacts and the at least one device-under-test ground contact on the probe tip are arranged to match the pitch of a differential ground-signal-signal-ground coplanar waveguide on a device-under-test.

20. A method for protecting a probe and a connected host instrument from electro-static discharge damage, the method comprising:
when a user is not probing a device-under-test, applying a spring force to a moveable probe tip in the probe to keep a connector on the probe tip disconnected from a probe cable that is connected to the host instrument, wherein the spring force is applied by a spring situated between the moveable probe tip and the probe cable; and
in response to the user probing the device-under-test with a force that overcomes the spring force, causing a ground conductor of the connector to connect to a ground conductor of the probe cable before a signal conductor of the connector connects to a signal conductor of the probe cable and the connected host instrument, such that a charge present on the device-under-test discharges through a high resistance electro-static discharge resistor coupled between the signal conductor and the ground conductor.

* * * * *